(12) United States Patent
Hasegawa et al.

(10) Patent No.: US 7,948,278 B2
(45) Date of Patent: May 24, 2011

(54) LOAD CAPACITY DRIVING CIRCUIT

(75) Inventors: Hideaki Hasegawa, Ibaraki (JP); Koji Higuchi, Ibaraki (JP); Atsushi Hirama, Chiba (JP); Koji Yamazaki, Ibaraki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 102 days.

(21) Appl. No.: 12/357,437

(22) Filed: Jan. 22, 2009

(65) Prior Publication Data

US 2009/0212832 A1     Aug. 27, 2009

(30) Foreign Application Priority Data

Feb. 21, 2008   (JP) .................. 2008-040162

(51) Int. Cl.
     *H03K 3/00*    (2006.01)
(52) U.S. Cl. .................. 327/112; 327/108
(58) Field of Classification Search .......... 327/111, 327/112
     See application file for complete search history.

(56) References Cited

U.S. PATENT DOCUMENTS

| | | | |
|---|---|---|---|
| 5,289,063 A | 2/1994 | Orisaka et al. | |
| 5,959,475 A * | 9/1999 | Zomorrodi | 327/112 |
| 2006/0091955 A1* | 5/2006 | Choi | 330/260 |
| 2006/0152256 A1* | 7/2006 | Su | 327/112 |
| 2007/0008020 A1* | 1/2007 | Lee et al. | 327/112 |
| 2007/0080723 A1* | 4/2007 | Lee et al. | 327/112 |
| 2008/0238497 A1* | 10/2008 | Yamazaki et al. | 327/111 |

FOREIGN PATENT DOCUMENTS

| | | |
|---|---|---|
| JP | 05-041651 | 2/1993 |
| JP | 5110406 A | 4/1993 |
| JP | 7-20717 | 4/1995 |
| JP | 8-186180 | 7/1996 |
| JP | 9-83338 | 3/1997 |
| JP | 2003-122325 | 4/2003 |
| JP | 2008-046358 | 2/2008 |
| KR | 10-2008-0015727 | 2/2008 |

OTHER PUBLICATIONS

Japanese office action dated Dec. 22, 2009 with English Translation.

* cited by examiner

*Primary Examiner* — Lincoln Donovan
*Assistant Examiner* — Ryan C Jager
(74) *Attorney, Agent, or Firm* — Volentine & Whitt, P.L.L.C.

(57) ABSTRACT

The present invention provides a load capacity driving circuit that is inexpensive and has a high driving capability. When an input signal changes to low potential, gate voltage of an output stage of an amplifying circuit increases, an NMOS transistor MNO turns on, and an NMOS transistor MN8 increases potential of a node NGAT. Due thereto, an NMOS transistor MNO2 also turns on, and a load capacity is discharged via the NMOS transistor MNO and the NMOS transistor MNO2. Further, when the input signal changes to high potential, gate voltage of the output stage of the amplifying circuit decreases, a PMOS transistor MPO turns on, and a PMOS transistor MP8 decreases potential of a node PGAT. Due thereto, a PMOS transistor MPO2 also turns on, and the load capacity is charged from a constant voltage source via the PMOS transistor MPO and the PMOS transistor MPO2.

7 Claims, 3 Drawing Sheets

LOAD CAPACITY DRIVING CIRCUIT

CROSS-REFERENCE TO RELATED APPLICATION

This application claims priority under 35 USC 119 from Japanese Patent Application No. 2008-040162, the disclosure of which is incorporated by reference herein.

BACKGROUND OF THE INVENTION

1. Field of the Invention

The present invention relates to a load capacity driving circuit. In particular, the present invention relates to a load capacity driving circuit that is suitable for driving a display device such as an LCD (liquid crystal display) or the like.

2. Description of the Related Art

As the screen sizes of liquid crystal display devices have become larger in recent years, improvements in the various performances of driving devices that drive LCDs also are demanded. In particular, as the screen sizes of liquid crystal display devices become larger, the load capacities of the data lines of the LCD are becoming larger. For this reason, improving the driving capability of the driving device has come to be important. Further, recently, competition in the field of liquid crystal display devices has become more fierce, and the costs of the respective mounted parts must be reduced. Accordingly, LCD driving devices that have a high driving capability and are inexpensive are demanded.

In relation thereto, Japanese Patent Application Laid-Open (JP-A) No. 2003-122325 discloses a technique of suppressing the amount of consumed electric power of a device. In this technique, when the difference in input and output signals of an output operational amplifier is compared at a comparator and the input signal is lower than the output signal by greater than or equal to a predetermined threshold voltage, an enable signal is outputted from the comparator, a switching transistor is turned on, and a large-current source is made effective. The output current at the time of discharging a load capacity can thereby be varied.

Further, a technique of reducing the on resistance of an output transistor is disclosed in FIG. 7 and in paragraph 0072 of JP-A No. 05-041651. In this technique, transistors of the output stage of an operational amplifier are provided in parallel in order to improve the current supplying capability.

In the technique of JP-A No. 2003-122325, at the time when the input signal is lower than the output signal by greater than or equal to the predetermined threshold voltage, discharging of the load capacity can be carried out rapidly. However, the operation until the input signal becomes lower than the output signal by greater than or equal to the predetermined threshold voltage is the same as conventional operation. Therefore, the efficacy of the above technique is very low, in a case in which the range of the output voltage is wide. Further, a structure for rapidly carrying out charging of a load capacity is not disclosed in JP-A No. 2003-122325.

The technique of JP-A No. 05-041651 includes a charging operation and a discharging operation. However, at the respective separate paths thereof, there is the need for control in accordance with either of the separate signals, and as a result, the structure of the control circuit becomes complex and an increase in surface area is brought about. Further, even if control is carried out merely by turning a transistor on and off, rapid response cannot be expected of a transistor that handles large current, and high-speed control is difficult.

SUMMARY OF THE INVENTION

The present invention provides a load capacity driving circuit that is inexpensive and has high driving capability.

A first aspect of the present invention is a load capacity driving circuit including: an operational amplifier having an inverting input end, a non-inverting input end and an output end, and the inverting input end and the output end are connected; a first NMOS transistor including a gate where a gate potential of an output stage of the operational amplifier is supplied, a drain connected to a power supply, and a source and a back gate connected to a first node; a second NMOS transistor including a gate where a predetermined first voltage is supplied, a drain connected to the first node, and a source that is grounded; and a third NMOS transistor including a gate connected to the first node, a drain connected to the output end of the operational amplifier, and a source that is grounded.

A second aspect of the present invention is a load capacity driving circuit including: an operational amplifier having an inverting input end, a non-inverting input end and an output end, and the inverting input end and the output end are connected; a first PMOS transistor including a gate where a gate potential of an output stage of the operational amplifier is supplied, a drain that is grounded, and a source and a back gate connected to a second node; a second PMOS transistor including a gate where a predetermined second voltage is supplied, a drain connected to the second node, and a source connected to a power supply; and a third PMOS transistor including a gate connected to the second node, a drain connected to the output end of the operational amplifier, and a source connected to a power supply.

A third aspect of the present invention is a load capacity driving circuit including: an operational amplifier having an inverting input end, a non-inverting input end and an output end, and the inverting input end and the output end are connected; a first NMOS transistor including a gate where a gate potential of an NMOS transistor of an output stage of the operational amplifier is supplied, a drain connected to a power supply, and a source and a back gate connected to a first node; a second NMOS transistor including a gate where a predetermined first voltage is supplied, a drain connected to the first node, and a source that is grounded; a third NMOS transistor including a gate connected to the first node, a drain connected to the output end of the operational amplifier, and a source that is grounded; a first PMOS transistor including a gate where a gate potential of a PMOS transistor of the output stage of the operational amplifier is supplied, a drain that is grounded, and a source and a back gate connected to a second node; a second PMOS transistor including a gate where a predetermined second voltage is supplied, a drain connected to the second node, and a source connected to a power supply; and a third PMOS transistor including a gate connected to the second node, a drain connected to the output end of the operational amplifier, and a source connected to a power supply.

In a fourth aspect of the present invention, in the above-described first or third aspect, a well to which the back gate of the first NMOS transistor is connected, and a well to which a back gate of the second NMOS transistor is connected, may be separate.

In a fifth aspect of the present invention, in the above-described second or third aspect, a well to which the back gate of the first PMOS transistor is connected, and a well to which a back gate of the second PMOS transistor is connected, may be separate.

In accordance with the above-described aspects, the present invention can inexpensively structure a load capacity driving circuit that has high driving capability.

BRIEF DESCRIPTION OF THE DRAWINGS

An exemplary embodiment of the present invention will be described in detail based on the following figures, wherein.

DETAILED DESCRIPTION OF THE INVENTION

Figure 2:
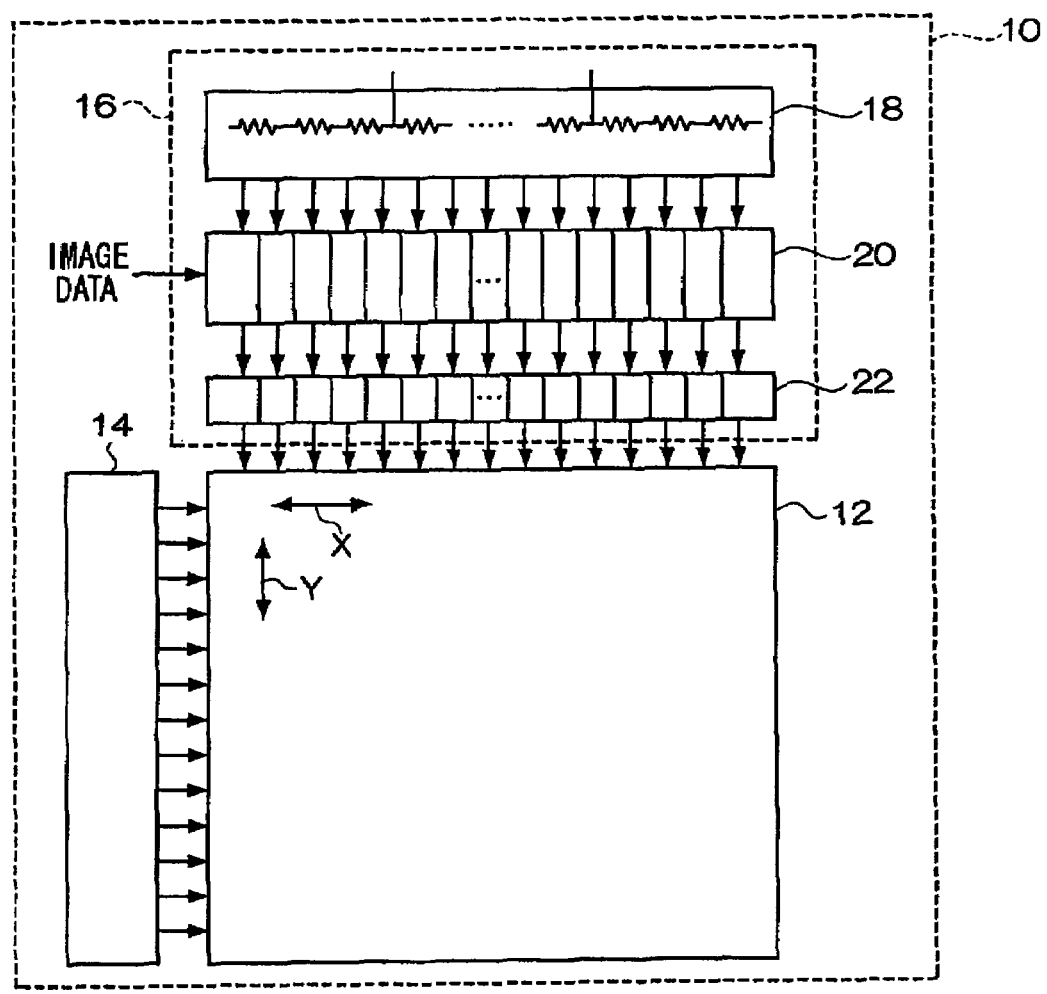
FIG. 2 is a schematic structural diagram of a liquid crystal display device that includes the driving circuit of FIG. 1.

An example of an exemplary embodiment of the present invention will be described in detail hereinafter with reference to the drawings. A liquid crystal display device 10 relating to the present exemplary embodiment is shown in FIG. 2. The liquid crystal display device 10 is structured by a gate driver 14, a source driver 16, and the like being connected to an LCD 12 that serves as a display device. Although not shown, in a case in which the LCD 12 is a TFT-LCD, the LCD 12 includes: liquid crystal sealed between a pair of transparent substrates that are disposed so as to oppose one another with a predetermined interval therebetween; electrodes formed on the entire opposing surface of one of the transparent substrates; numerous data lines disposed on the opposing surface of the other of the transparent substrates at uniform intervals in the X direction, and respectively extending along the Y direction; numerous gate lines disposed at uniform intervals in the Y direction, and respectively extending along the X direction; thin film transistors (TFTs) disposed at the respective intersecting positions of the individual data lines and the individual gate lines (the pixel positions); and electrodes that are respectively provided. Further, at each of the TFTs, the source is connected to the electrode, the gate is connected to the gate line, and the drain is connected to the data line.

Note that the LCD 12 is not limited to a TFT-LCD, and may be a liquid crystal display of another structure. Further, the display device is not limited to an LCD, and may be another known display device having a load capacity.

The individual gate lines of the LCD 12 are connected to the gate driver 14, respectively. The individual data lines of the LCD 12 are connected to the source driver 16, respectively. The gate driver 14 is connected to a timing controller (not shown). In accordance with a gate driver control signal inputted from the timing controller, the gate driver 14 supplies, for a predetermined time period, a gate signal to one of the gate lines among the numerous gate lines of the LCD 12. Then, the gate driver 14 turns the TFTs of the one line of pixels that are connected to that gate line on for a predetermined time period. While switching, in order, the gate line to which the gate signal is supplied, the gate driver 14 repeats these processes at a timing that is synchronous with a horizontal synchronization signal.

On the other hand, the source driver 16 has a gradation voltage generating circuit 18, plural D/A converters 20, and driving circuits 22. The gradation voltage generating circuit 18 generates plural types of gradation voltages having voltage levels that differ from one another. Each of the plural D/A converters 20 is provided in respective correspondence with the individual data lines of the LCD 12, and is connected to the gradation voltage generating circuit. Each of the driving circuits 22 is provided in respective correspondence with the individual data lines of the LCD 12, and is connected to a different one of the D/A converters 20. The source driver 16 is connected to the timing controller (not shown). At respective periods of the horizontal synchronization signal, image data of one pixel that differ from one another, among the image data of one line of the LCD 12 running along the X direction in FIG. 2 that is extracted from the image data expressing the image to be displayed on the LCD 12 (the RGB data expressing the levels of the data voltages to be supplied to the individual data lines of the LCD 12), are inputted in parallel to the individual D/A converters 20 from the timing controller. Each of the D/A converters 20 selects and outputs the gradation voltage, that corresponds to the inputted data of one pixel, from among the plural types of gradation voltage generated at the gradation voltage generating circuit 18.

Although the structure of the driving circuit 22 will be described later, the gradation voltages that are selected and outputted at the D/A converters 20 are respectively inputted as input signals IN to the driving circuits 22 that are connected to the individual D/A converters 20. The driving circuits 22 supply data voltages corresponding to the input signals IN, for a uniform time period to the corresponding data lines. From the standpoint of each individual driving circuit 22, the pixel, that corresponds to the TFT that is connected to the corresponding data line and that is turned on by the gate signal from the gate driver 14, is a load capacity. The load capacity is charged and discharged by the supply of data voltage to the corresponding data line, and the light permeability of the liquid crystal at the corresponding pixel position varies in accordance with voltage at the both ends of the load capacity. Due thereto, the pixels of one line are displayed on the LCD 12. Next, the gate line, to which a gate signal is supplied by the gate driver 14, is switched in order. Together therewith, the line, whose image data are inputted to the plural D/A converters 20 of the source driver 16, is switched in order. The image is thereby displayed on the LCD 12.

Figure 1:
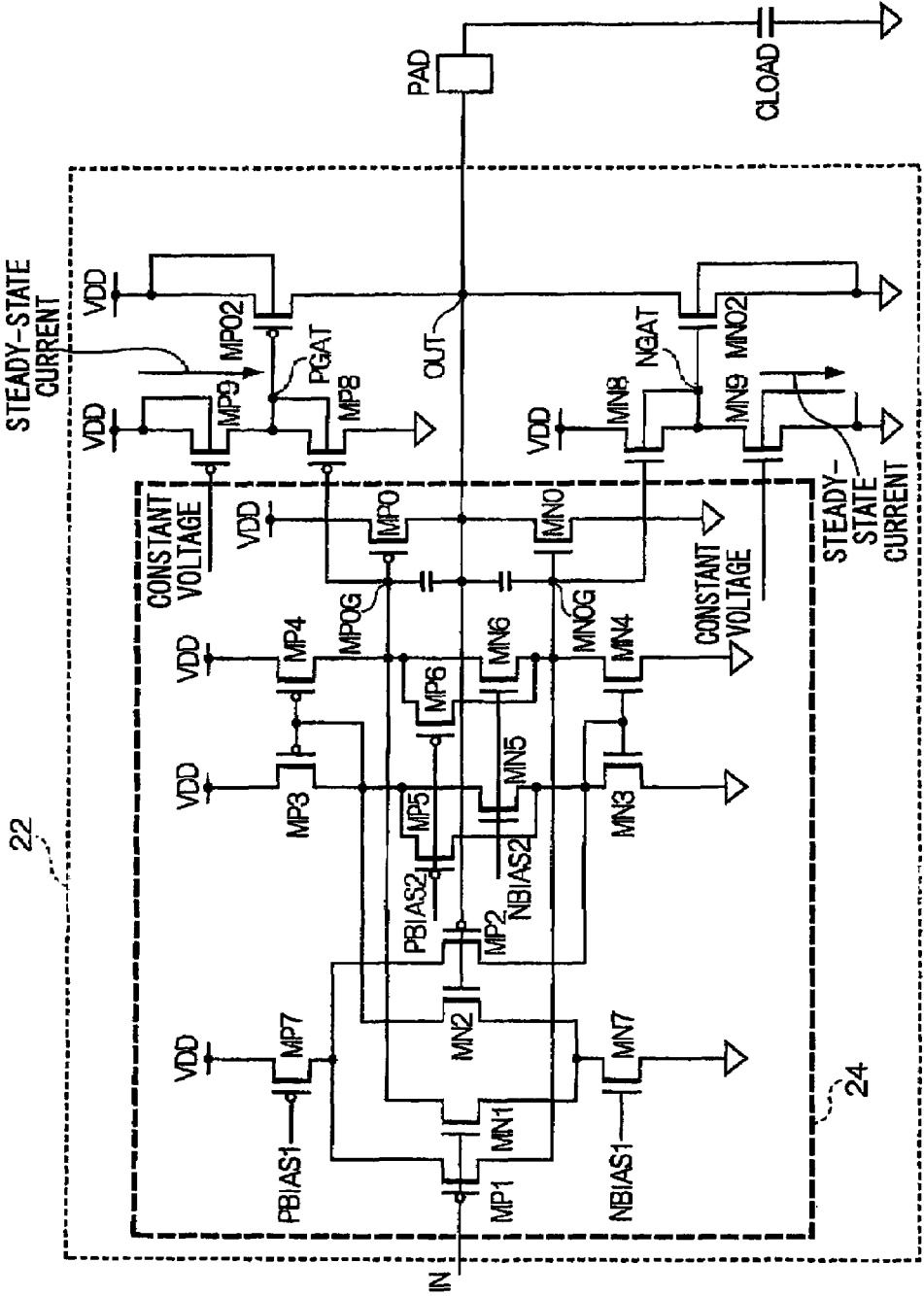
FIG. 1 is a circuit diagram of a driving circuit relating to the present exemplary embodiment.

The structure of the driving circuit 22 will be described next with reference to FIG. 1. The driving circuit 22 has an amplifying circuit (operational amplifier) 24 to which the input signal IN from the D/A converter 20 is inputted. Note that the amplifier circuit 24 is shown by a detailed circuit diagram in FIG. 1. However, this circuit diagram shows the circuit structure of a general operational amplifier that carries out rail to rail operation, and description of the structure and the operation is omitted. The gates of a PMOS transistor MP1 and an NMOS transistor MN1 are the non-inverting input end of the amplifying circuit 24. The input signal IN from the D/A converter 20 is inputted to this non-inverting input end. Note that the driving circuit 22 illustrates a load capacity driving circuit, and the amplifying circuit 24 illustrates an operational amplifier.

Further, the gates of a PMOS transistor MP2 and an NMOS transistor MN2 are the inverting input end of the amplifying circuit 24, and the connection point of a PMOS transistor MPO2 and an NMOS transistor MNO of the output stage is the output end. Due to the aforementioned inverting input end and the output end being connected, the amplifying circuit 24 relating to the present exemplary embodiment functions as a voltage follower. Further, a node OUT that is connected to the output end of the driving circuit 22 is connected to an output pad PAD of the driver IC that accommodates the source driver 16. The node OUT is also connected to any of the numerous data lines provided at the LCD 12. Accordingly, the output signal from the node OUT of the driving circuit 22 passes through the output pad PAD and is supplied to a load capacity CLOAD of the LCD 12.

The driving circuit 22 has NMOS transistors MN8, MN9, MNO2. The drain of the NMOS transistor MN9 is connected to a node NGAT, and constant voltage is applied to the gate of the NMOS transistor MN9, and the source and the back gate (also called the substrate gate) are respectively connected to ground. The NMOS transistor MN9 compares the potential of the source and the potential of the gate, and turns on when the potential of the gate is higher than the potential of the source by greater than or equal to a threshold value. Here, the constant voltage that is applied to the gate of the NMOS transistor MN9 is voltage that is higher than ground potential GND by greater than or equal to the threshold voltage of the NMOS transistor MN9. Accordingly, while electric power is being supplied to the driving circuit 22, the NMOS transistor MN9 is always in an on state and constant current always flows.

The drain of the NMOS transistor MN8 is connected to a constant voltage power supply, and the gate is connected to the gate of the NMOS transistor MN0 of the output stage of the amplifying circuit 24, and the source and back gate are respectively connected to the node NGAT. By being connected to the constant voltage power supply, the drain of the NMOS transistor MN8 is maintained at power supply potential VDD. Further, by being connected to the gate of the NMOS transistor MN0 of the output stage of the amplifying circuit 24, the gate of the NMOS transistor MN8 is the gate potential of the output stage of the amplifying circuit 24. Moreover, the drain of the NMOS transistor MN02 is connected to the node OUT, the gate is connected to the node NGAT, and the source and back gate are respectively connected.

Note that the NMOS transistor MN8 illustrates a first NMOS transistor, the NMOS transistor MN9 illustrates a second NMOS transistor, and the NMOS transistor MN02 illustrates a third NMOS transistor. The NMOS transistor MN0 of the output stage of the amplifying circuit 24 illustrates the NMOS transistor of the output stage of the operational amplifier.

Further, the driving circuit 22 has PMOS transistors MP8, MP9, MP02. The source and the back gate (also called substrate gate) of the PMOS transistor MP9 are respectively connected to a constant voltage power supply, and constant voltage is applied to the gate. The drain of the PMOS transistor MP9 is connected to a node PGAT. The source and the back gate of the PMOS transistor MP9 are maintained at the power supply potential VDD. The PMOS transistor MP9 compares the potential of the source and the potential of the gate, and turns on when the potential of the gate is lower than the potential of the source by greater than or equal to a threshold value. Here, the constant voltage that is applied to the gate of the PMOS transistor MP9 is voltage that is lower than the power supply potential VDD by greater than or equal to the threshold voltage of the PMOS transistor MP9. Accordingly, while electric power is being supplied to the driving circuit 22, the PMOS transistor MP9 is always in an on state and constant current always flows.

The source and the back gate of the PMOS transistor MP8 are connected to the node PGAT, the gate is connected to the gate of a PMOS transistor MP0 of the output stage of the amplifying circuit 24, and the drain is connected to ground. The gate of the PMOS transistor MP8 is made to be the gate potential of the output stage of the amplifying circuit 24. Further, the source and the back gate of the PMOS transistor MP02 are respectively connected to a constant voltage power supply and are maintained at the power supply potential VDD, and the gate is connected to the node PGAT, and the drain is connected to the node OUT.

Note that the PMOS transistor MP8 illustrates a first PMOS transistor, the PMOS transistor MP9 illustrates a second PMOS transistor, and the PMOS transistor MP02 illustrates a third PMOS transistor. The PMOS transistor MP0 of the output stage of the amplifying circuit 24 illustrates the PMOS transistor of the output stage of the operational amplifier.

Figure 3:
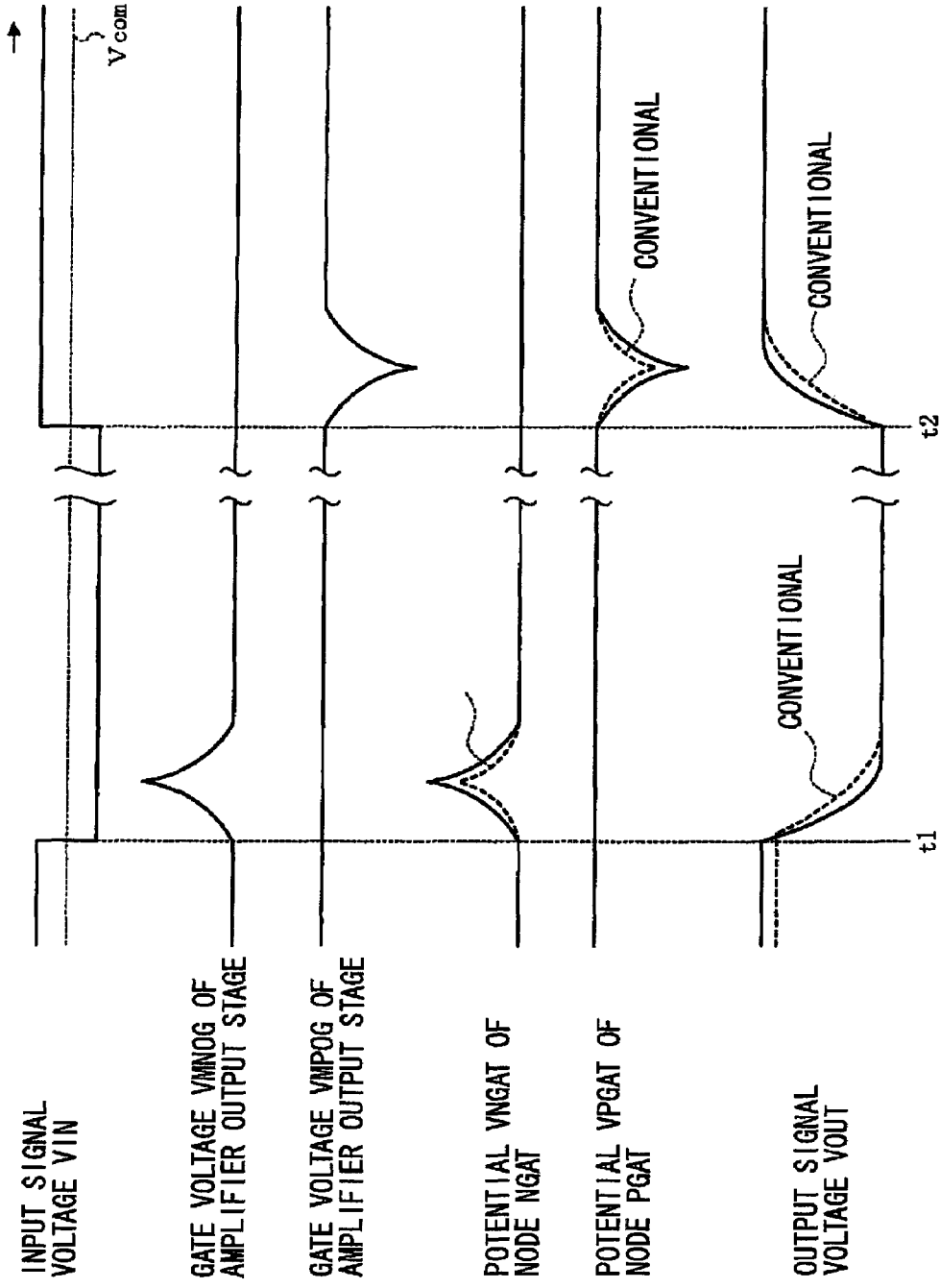
FIG. 3 is a timing chart explaining operation of the driving circuit.

Next, operation of the driving circuit 22 will be described with reference to FIG. 3 as the operation of the present exemplary embodiment. As shown in FIG. 3, at time t1, voltage VIN of the input signal IN to the driving circuit 22 (the amplifying circuit 24) changes from a potential that is higher than common potential Vcom to a potential that is lower than the common potential Vcom. Due to a potential difference arising between the input signal voltage VIN and output signal voltage VOUT, gate voltage VMNOG of the NMOS transistor MN0 of the output stage of the amplifying circuit 24 increases. Due thereto, the NMOS transistor MN0 turns on. Further, due to the gate voltage VMNOG increasing, the NMOS transistor MN8, whose gate is connected to the gate of the NMOS transistor MN0, also turns on. Due to the NMOS transistor MN8 turning on, potential VNGAT of the node NGAT also increases in the same way as the gate voltage VMNOG. Due to this change in the potential VNGAT being inputted to the gate of the NMOS transistor MN02, the NMOS transistor MN02 also turns on in the same way as the NMOS transistor MN0.

Due thereto, the node OUT (the output end of the amplifying circuit 24) is connected to ground via the NMOS transistor MN0 of the output stage of the amplifying circuit 24. Together therewith, the node OUT is connected to ground via the NMOS transistor MN02 as well. Accordingly, the charges of the load capacity CLOAD of the liquid crystal panel are discharged suddenly via the NMOS transistor MN0 and the NMOS transistor MN02. Therefore, the output signal voltage VOUT drops suddenly.

When the potential difference between the input signal voltage VIN and the output signal voltage VOUT becomes small, the gate voltage VMNOG decreases. Then, the potential VNGAT of the node NGAT decreases in the same way as the gate voltage VMNOG. Due thereto, the current flowing through the NMOS transistor MN0 and the NMOS transistor MN02 (the discharge current of the load capacity CLOAD) also decreases. Then, the NMOS transistor MN0, the NMOS transistor MN8 and the NMOS transistor MN02 respectively turn off. The discharging of the load capacity CLOAD of the liquid crystal panel thereby ends.

At time t2, the voltage VIN of the input signal IN to the driving circuit 22 (the amplifying circuit 24) changes from a potential that is lower than the common potential Vcom to a potential that is higher than the common potential Vcom. Due to a potential difference arising between the input signal voltage VIN and the output signal voltage VOUT, gate voltage VMPOG of the PMOS transistor MP0 of the output stage of the amplifying circuit 24 decreases. Then, the PMOS transistor MP0 turns on. Moreover, the gate voltage VMPOG decreases. Due thereto, the PMOS transistor MP8, whose gate is connected to the gate of the PMOS transistor MP0, also turns on. Due to the PMOS transistor MP8 turning on, potential VPGAT of the node PGAT also decreases in the same way as the gate voltage VMPOG. Due to this change in the potential VPGAT being inputted to the gate of the PMOS transistor MP02, the PMOS transistor MP02 also turns on in the same way as the PMOS transistor MP0.

Due thereto, the node OUT (the output end of the amplifying circuit 24) is connected to the constant voltage power supply via the PMOS transistor MP0 of the output stage of the amplifying circuit 24. Together therewith, the node OUT (the output end of the amplifying circuit 24) is connected to the constant voltage power supply via the PMOS transistor MP02 as well. Accordingly, the load capacity CLOAD is charged suddenly by the current that flows from the constant voltage power supply to the load capacity CLOAD of the liquid crystal panel via the PMOS transistor MP0 and the PMOS transistor MP02. Therefore, the output signal voltage VOUT increases suddenly.

When the potential difference between the input signal voltage VIN and the output signal voltage VOUT becomes small, the gate voltage VMPOG increases. Due to the potential VPGAT of the node PGAT also increasing in the same way as the gate voltage VMPOG, the current that flows through the PMOS transistor MPO and the PMOS transistor MPO2 (the charge current of the load capacity CLOAD) decreases. Then, the PMOS transistor MPO, the PMOS transistor MP8 and the PMOS transistor MPO2 respectively turn off. The charging of the load capacity CLOAD of the liquid crystal panel thereby ends.

In this way, in accordance with the present exemplary embodiment, the gate potential VMNOG of the NMOS transistor MNO and the gate potential VMPOG of the PMOS transistor MPO of the output stage of the amplifying circuit 24 are utilized, and operations of the NMOS transistor MNO2 and the PMOS transistor MPO2 are controlled via the NMOS transistor MN8 and the PMOS transistor MP8. The output signal voltage VOUT can thereby be made to follow, at high speed, changes in the input signal voltage VIN. Further, there is no need for an external control signal for controlling the operations of the NMOS transistor MNO2 and the PMOS transistor MPO2. Accordingly, there is no need to provide an exclusive-use control circuit such as a timing controller or the like, and the costs involved in developing a control circuit can be cut. Further, the circuit surface area can be reduced by an amount corresponding to a control circuit. Moreover, the driving capability of the driving circuit 22 can be improved without the steady-state current of the amplifying circuit 24 increasing.

In a case in which the same type of MOS transistors, that are adjacent to one another and whose drain and source are connected, exist within the circuit such as the NMOS transistor MN8 and the NMOS transistor MN9, or the PMOS transistor MP8 and the PMOS transistor MP9, of the driving circuit 22, usually, the back gates of these MOS transistors are connected (made to be the same potential) by making the well to which the back gates of these MOS transistors are connected be a common well. However, if the back gates of the NMOS transistor MN8 and the NMOS transistor MN9 of the driving circuit 22 are connected, a potential difference arises between the source and the back gate of the NMOS transistor MN8. Due thereto, the response speed (turning-on timing) of the NMOS transistor MN8 with respect to an increase in the gate voltage VMNOG inputted to the gate of the NMOS transistor MN8 becomes slow. Namely, as shown by the broken line in FIG. 3, the slope of the change and the amount of change of the potential VNGAT of the node NGAT become small. Further, also if the back gates of the PMOS transistor MP8 and the PMOS transistor MP9 of the driving circuit 22 are connected (the well to which the respective back gates thereof are connected is used in common), a potential difference arises at the source and the back gate of the PMOS transistor MP8. Due thereto, the response speed (turning-on timing) of the PMOS transistor MP8 with respect to a decrease in the gate voltage VMPOG inputted to the gate of the PMOS transistor MP8 becomes slow. Namely, as shown by the broken line in FIG. 3, the slope of the change and the amount of change of the potential VPGAT of the node PGAT become small.

In contrast, in the present exemplary embodiment, the back gate of the NMOS transistor MN8 is not connected to the back gate of the NMOS transistor MN9 (the wells to which the respective back gates thereof are connected are separate). Namely, due to the source and the back gate of the NMOS transistor MN8 respectively being connected to the node NGAT, the source and the back gate of the NMOS transistor MN8 are made to be the same potential. Due thereto, the response speed of the NMOS transistor MN8 with respect to an increase in the gate voltage VMNOG inputted to the gate of the NMOS transistor MN8 becomes fast (the turning-on timing is earlier). Namely, as shown by the solid line in FIG. 3, the slope of the change and the amount of change of the potential VNGAT of the node NGAT become large. Accompanying this, the current that flows through the NMOS transistor MNO2 (the discharge current of the load capacity CLOAD) becomes large. Accordingly, as is clear also from comparing the waveform shown by the solid line as the output signal voltage VOUT with the waveform shown by the broken line, the charges of the load capacity CLOAD of the liquid crystal panel can discharge sufficiently in a shorter time.

Further, in the present exemplary embodiment, the back gate of the PMOS transistor MP8 as well is not connected to the back gate of the PMOS transistor MP9 (the wells to which the respective back gates thereof are connected are separate). Namely, due to the source and the back gate of the PMOS transistor MP8 respectively being connected to the node PGAT, the source and the back gate of the PMOS transistor MP8 are made to be the same potential. Due thereto, the response speed of the PMOS transistor MP8 with respect to an increase in the gate voltage VMPOG inputted to the gate of the PMOS transistor MP8 becomes fast (the turning-on timing is earlier). Namely, as shown by the solid line in FIG. 3, the slope of the change and the amount of change of the potential VPGAT of the node PGAT become large. Accompanying this, the current that flows through the PMOS transistor MPO2 (the charge current of the load capacity CLOAD) becomes large. Accordingly, as is clear from comparing the waveform shown by the solid line as the output signal voltage VOUT with the waveform shown by the broken line, the load capacity CLOAD of the liquid crystal panel can charge in a shorter time.

The source and the back gate of the NMOS transistor MN8 are made to be the same potential in the present exemplary embodiment. Due thereto, as described above, the slope of the change and the amount of change of the potential VNGAT of the node NGAT can be made to be greater than in a case in which the back gates of the NMOS transistor MN8 and the NMOS transistor MN9 are connected. Accordingly, the size of the NMOS transistor MNO2 whose gate is connected to the node NGAT can be made to be smaller. Further, the source and the back gate of the PMOS transistor MP8 are made to be the same potential in the present exemplary embodiment. Due thereto, as described above, the slope of the change and the amount of change of the potential VPGAT of the node PGAT can be made to be greater than in a case in which the back gates of the PMOS transistor MP8 and the PMOS transistor MP9 are connected. Accordingly, the size of the PMOS transistor MPO2 whose gate is connected to the node PGAT can be made to be smaller.

Accompanying this, the parasitic capacities of the NMOS transistor MNO2 and the PMOS transistor MPO2 become small. Therefore, the phase delay of the output signals that are fed-back from the NMOS transistor MNO2 and the PMOS transistor MPO2 via the node OUT to the inverting input end of the amplifying circuit 24 (the gates of the PMOS transistor MP2 and the NMOS transistor MN2) can be made to be small. Accordingly, the oscillation stability of the driving circuit 22 (the amplifying circuit 24) can be improved.

Note that the minimum structural elements of the present invention in the driving circuit 22 are the amplifying circuit 24, and the NMOS transistors MN8, MN9, MNO2 or the PMOS transistors MP8, MP9, MPO2. An aspect in which the present invention is applied only to the discharging or to the charging of the load capacity CLOAD, and the circuit formed from the NMOS transistors MN8, MN9, MNO2, or the circuit formed from the PMOS transistors MP8, MP9, MPO2, is replaced by a circuit of another structure, also is included within the scope of the present invention. Further, the operational amplifier relating to the present invention is not limited to a structure that carries out rail to rail operation such as the amplifying circuit 24, and another structure may be used.

What is claimed is:

1. A load capacity driving circuit comprising:
   an operational amplifier having an inverting input end, a non-inverting input end and an output end, and the inverting input end and the output end are connected;
   a first NMOS transistor including a gate where a gate potential of an output stage of the operational amplifier is supplied, a drain connected to a power supply, and a source and a back gate connected to a first node;
   a second NMOS transistor including a gate where a predetermined first voltage is supplied, a drain connected to the first node, and a source that is grounded; and
   a third NMOS transistor including a gate connected to the first node, a drain connected to the output end of the operational amplifier, and a source that is grounded.

2. The load capacity driving circuit of claim 1, wherein a well to which the back gate of the first NMOS transistor is connected, and a well to which a back gate of the second NMOS transistor is connected, are separate.

3. A load capacity driving circuit comprising:
   an operational amplifier having an inverting input end, a non-inverting input end and an output end, and the inverting input end and the output end are connected;
   a first PMOS transistor including a gate where a gate potential of an output stage of the operational amplifier is supplied, a drain that is grounded, and a source and a back gate connected to a second node;
   a second PMOS transistor including a gate where a predetermined second voltage is supplied, a drain connected to the second node, and a source connected to a power supply; and
   a third PMOS transistor including a gate connected to the second node, a drain connected to the output end of the operational amplifier, and a source connected to a power supply.

4. The load capacity driving circuit of claim 3, wherein a well to which the back gate of the first PMOS transistor is connected, and a well to which a back gate of the second PMOS transistor is connected, are separate.

5. A load capacity driving circuit comprising:
   an operational amplifier having an inverting input end, a non-inverting input end and an output end, and the inverting input end and the output end are connected;
   a first NMOS transistor including a gate where a gate potential of an NMOS transistor of an output stage of the operational amplifier is supplied, a drain connected to a power supply, and a source and a back gate connected to a first node;
   a second NMOS transistor including a gate where a predetermined first voltage is supplied, a drain connected to the first node, and a source that is grounded;
   a third NMOS transistor including a gate connected to the first node, a drain connected to the output end of the operational amplifier, and a source that is grounded;
   a first PMOS transistor including a gate where a gate potential of a PMOS transistor of the output stage of the operational amplifier is supplied, a drain that is grounded, and a source and a back gate connected to a second node;
   a second PMOS transistor including a gate where a predetermined second voltage is supplied, a drain connected to the second node, and a source connected to a power supply; and
   a third PMOS transistor including a gate connected to the second node, a drain connected to the output end of the operational amplifier, and a source connected to a power supply.

6. The load capacity driving circuit of claim 5, wherein a well to which the back gate of the first NMOS transistor is connected, and a well to which a back gate of the second NMOS transistor is connected, are separate.

7. The load capacity driving circuit of claim 5, wherein a well to which the back gate of the first PMOS transistor is connected, and a well to which a back gate of the second PMOS transistor is connected, are separate.

* * * * *